(12) United States Patent
Heo et al.

(10) Patent No.: US 10,734,554 B2
(45) Date of Patent: Aug. 4, 2020

(54) LIGHT EMITTING DIODE HAVING DISTRIBUTED BRAGG REFLECTOR

(71) Applicant: Seoul Viosys Co., Ltd., Ansan-si (KR)

(72) Inventors: Min Chan Heo, Ansan-si (KR); Kyoung Wan Kim, Ansan-si (KR); Ye Seul Kim, Ansan-si (KR); Yong Woo Ryu, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/354,815

(22) Filed: Mar. 15, 2019

(65) Prior Publication Data

US 2020/0212263 A1 Jul. 2, 2020

Related U.S. Application Data

(63) Continuation of application No. PCT/KR2018/008899, filed on Aug. 6, 2018.

(30) Foreign Application Priority Data

Aug. 24, 2017 (KR) .................. 10-2017-0107293
Aug. 2, 2018 (KR) .................. 10-2018-0090328

(51) Int. Cl.
*H01L 33/46* (2010.01)
*H01L 33/42* (2010.01)

(52) U.S. Cl.
CPC ............. *H01L 33/46* (2013.01); *H01L 33/42* (2013.01)

(58) Field of Classification Search
CPC ................................ H01L 33/46; H01L 33/42
See application file for complete search history.

(56) References Cited

U.S. PATENT DOCUMENTS

2011/0261849 A1 10/2011 Shinagawa et al.
2013/0058102 A1 3/2013 Lin
(Continued)

FOREIGN PATENT DOCUMENTS

JP 2009016505 1/2009
JP 2016146407 8/2016
(Continued)

OTHER PUBLICATIONS

International Search Report dated Dec. 13, 2018 in International Application No. PCT/KR2018/008899 (with Translation).
(Continued)

*Primary Examiner* — Timor Karimy
(74) *Attorney, Agent, or Firm* — H.C. Park & Associates, PLC

(57) ABSTRACT

A light emitting diode including a light emitting structure including an active layer, a first distributed Bragg reflector (DBR) disposed on one side of the light emitting structure to reflect light emitted from the light emitting structure, and an interfacial layer disposed between the light emitting structure and the first DBR, in which the first DBR includes first material layers having a low refractive index and second material layers having a high refractive index alternately stacked one above another, the interfacial layer has a lower refractive index than the first material layers, and has a thickness greater than a thickness of each of the first and second material layers, and one a second material layer of the second material layers that is closest to the interfacial layer includes a first sub-layer and a second sub-layer, the first sub-layer having a density lower than that of the second sub-layer.

22 Claims, 9 Drawing Sheets

(56) References Cited

U.S. PATENT DOCUMENTS

| | | |
|---|---|---|
| 2013/0240937 A1 | 9/2013 | Chae et al. |
| 2014/0209949 A1 | 7/2014 | Chuang et al. |
| 2015/0340347 A1 | 11/2015 | Jung et al. |
| 2017/0005242 A1 | 1/2017 | Kim et al. |

FOREIGN PATENT DOCUMENTS

| | | |
|---|---|---|
| KR | 10-2012-0024489 | 3/2012 |
| KR | 10-2017-0005317 | 1/2017 |
| KR | 10-2017-0047664 | 5/2017 |

OTHER PUBLICATIONS

Extended European Search Report dated Feb. 10, 2020, issued in EP Patent Application No. 18847133.8.

LIGHT EMITTING DIODE HAVING DISTRIBUTED BRAGG REFLECTOR

CROSS REFERENCE TO RELATED APPLICATIONS

This application is a Continuation of International Patent Application No. PCT/KR2018/008899, filed on Aug. 6, 2018, and claims priority from and the benefit of Korean Patent Application No. 10-2017-0107293, filed on Aug. 24, 2017, and Korean Patent Application No. 10-2018-0090328, filed on Aug. 2, 2018, each of which are hereby incorporated by reference for all purposes as if fully set forth herein.

BACKGROUND

Field

Exemplary embodiments of the invention relate generally to a light emitting diode, and more specifically, to a light emitting diode including a distributed Bragg reflector.

Discussion of the Background

A GaN-based light emitting diode configured to emit blue light or UV light is used in various applications. In addition, various kinds of light emitting diode packages configured to emit mixed light, for example, white light, for a backlight unit or general lighting, are commercially available in the market.

Since light output of a light emitting diode package generally depends on luminous efficacy of a light emitting diode chip, continuous attempts have been made to improve luminous efficacy of the light emitting diode chip. For example, a rough surface is formed on one surface of a light exit plane, or the shape of an epitaxial layer or a transparent substrate is modified in order to improve light extraction efficiency of the light emitting diode chip.

Alternatively, a metal reflector such an Al reflector is provided to the other surface of the light exit plane in order to improve luminous efficacy through reflection of light traveling towards a chip mounting plane. Luminous efficacy of the light emitting diode chip can be improved by reducing light loss through reflection of light using the metal reflector. However, the reflectance such a reflective metal is likely to suffer from deterioration in reflectance due to oxidation and the metal reflector has relatively low reflectance.

Accordingly, a distributed Bragg reflector (DBR) formed by alternately stacking materials having different refractive indices is used in order to achieve high reflectance while securing relatively stable reflection characteristics.

The DBR is generally formed by alternately stacking high refractive material layers and low refractive material layers. Particularly, a DBR having high reflectance in a certain spectrum range including a central wavelength, that is, in the stop band, can be formed by alternately stacking high refractive material layers and low refractive material layers each having an optical thickness (actual thickness×refractive index) equal to, approximately, $\lambda/4$ ($\lambda$: central wavelength).

However, the DBR may have poor adhesion characteristics to a layer on which it is formed, and an optically transparent interfacial layer needs to be used in order to overcome this problem. This interfacial layer is formed to be relatively thicker than a thickness of each layer of the DBR for stable adhesion. As a result, light absorption occurs in the interfacial layer as well as in the DBR, and the luminous efficacy may be lowered.

The above information disclosed in this Background section is only for understanding of the background of the inventive concepts, and, therefore, it may contain information that does not constitute prior art.

SUMMARY

Exemplary embodiments of the present invention provide a light emitting diode having an improved reflecting structure.

Exemplary embodiments of the present invention also provide a light emitting diode having a stable structure and reducing light loss caused by light absorption to improve the luminous efficacy.

Additional features of the inventive concepts will be set forth in the description which follows, and in part will be apparent from the description, or may be learned by practice of the inventive concepts.

An exemplary embodiment of the present invention provides a light emitting diode including a light emitting structure including an active layer; and a distributed Bragg reflector (DBR) disposed on one side of the light emitting structure to reflect light emitted from the light emitting structure, an interfacial layer disposed between the light emitting structure and the distributed Bragg reflector, in which the DBR includes first material layers having a low refractive index and second material layers having a high refractive index, the first and second material layers being alternately stacked one above another, the interfacial layer has a lower refractive index than that of the first material layers, and has a thickness greater than a thickness of each layer of the first material layers and the second material layers, and a second material layer of the second material layers that is closest to the interfacial layer includes a first sub-layer and a second sub-layer, the first sub-layer having a density lower than that of the second sub-layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 10B is an optical photograph depicting that no peeling of DBR has occurred, according to a structure of a first layer of the DBR.

DETAILED DESCRIPTION

Figure 1:
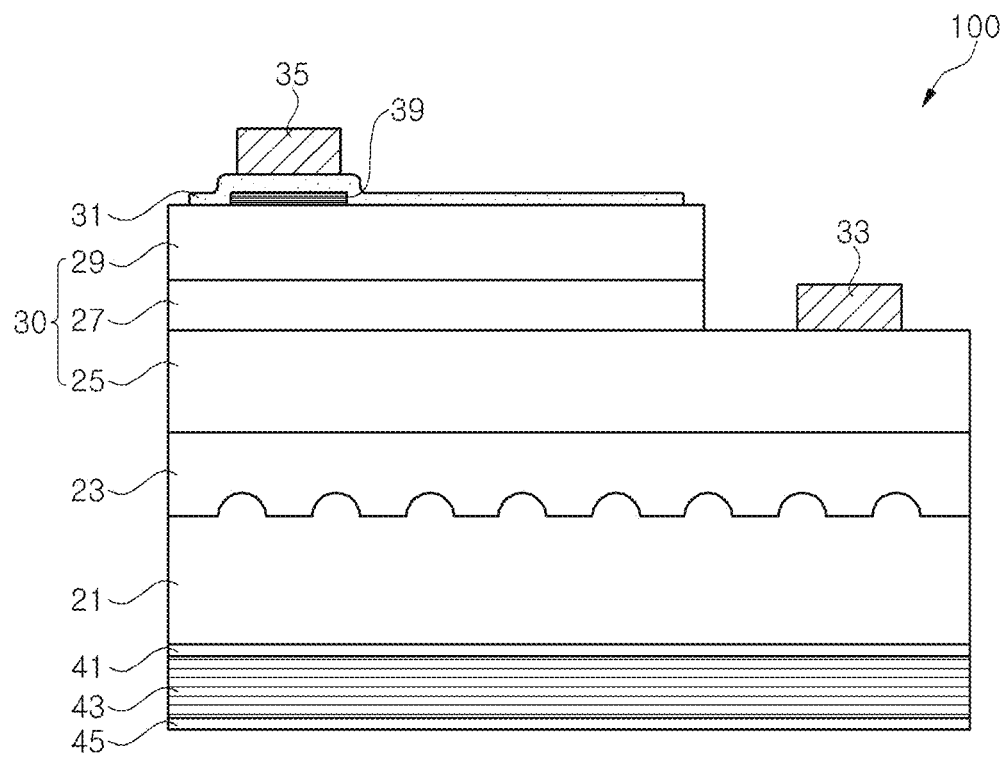
FIG. 1 is a cross-sectional view illustrating a light emitting diode according to an exemplary embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein. In accordance with one exemplary embodiment of the present invention, a light emitting diode includes a light emitting structure including an active layer, and a distributed Bragg reflector (DBR) disposed on one side of the light emitting structure to reflect light emitted from the light emitting structure, and an interfacial layer disposed between the light emitting structure and the distributed Bragg reflector, in which the DBR includes first material layers having a low refractive index and second material layers having a high refractive index, the first and second material layers being alternately stacked one above another, the interfacial layer has a lower refractive index than the first material layers, and has a thickness greater than a thickness of each layer of the first material layers and the second material layers, and a second material layer of the second material layers that is closest to the interfacial layer includes a first sub-layer having a low density and a second sub-layer having a high density.

The interfacial layer may reduce influence of a rough bottom surface of the substrate on the DBR formed on the bottom surface of the substrate. Furthermore, by using a material layer having a refractive index lower than that of the first material layer as the interfacial layer, light loss may be reduced using total internal reflection. In addition, since the second material layer closest to the interfacial layer may include the first sub-layer and the second sub-layer having different densities, a difference in stress between the interfacial layer and the second material layer may be reduced, thereby preventing the DBR from being peeled.

The interfacial layer may be a $MgF_2$ layer, the first material layers may be $SiO_2$ layers, and the second material layers may be $TiO_2$ layers.

In addition, the interfacial layer may be subjected to a tensile stress, the first sub-layer may be subjected to a tensile stress, and the second sub-layer may be subjected to a compressive stress.

Further, the first sub-layer may be disposed closer to the interfacial layer than the second sub-layer. It is possible to prevent stress concentration between the first material layer and the interfacial layer by placing the tensile stressed first sub-layer close to the tensile stressed interfacial layer.

In some exemplary embodiments, second material layers other than the one closest to the interfacial layer may have a relatively higher density than the first sub-layer. Since the second material layers may have a relatively high density, it is possible to prevent moisture or the like from permeating into the DBR, thereby maintaining a stable reflection wavelength band.

The second material layer closest to the interfacial layer may contact the interfacial layer.

Alternatively, the light emitting diode may further include a substrate, and the light emitting structure may be disposed on the substrate.

In one exemplary embodiment, the interfacial layer may be opposite to the light emitting structure and contact the substrate. Furthermore, the light emitting diode may further include another DBR disposed on the light emitting structure. The another DBR may be disposed within an upper region of the active layer. Moreover, the light emitting diode may further include a transparent electrode layer covering the another DBR.

In another exemplary embodiment, the light emitting structure may be disposed between the substrate and the interfacial layer. The DBR may cover an upper surface and side surfaces of the light emitting structure. Furthermore, the light emitting diode may further include another DBR disposed between the DBR and the light emitting structure. The another DBR may be disposed within the upper region of the active layer. Moreover, the light emitting diode may further include a transparent electrode layer disposed between the DBR and the another DBR and covering the another DBR.

In another exemplary embodiment, the DBR may be disposed within the upper region of the active layer.

The light emitting diode may further include a surface layer disposed on an uppermost layer of the DBR opposite to the interfacial layer, in which the surface layer is formed of the same material as the first material layers in the DBR and has a greater thickness than each of the first material layers. The surface layer prevents the DBR from being damaged by a rough surface of a mounting plane of the light emitting diode upon packaging of the light emitting diode.

In some exemplary embodiments, the DBR may includes a first region in which a first group of first material layers having optical thicknesses greater than 0.25λ+10% and a second group of first material layers having optical thicknesses greater than 0.25λ−10% and less than 0.25λ+10% are alternately arranged, a second region including a third group of first material layers having optical thicknesses less than 0.25λ−10% and consecutively arranged, and a third region disposed between the first region and the second region and including a first material layer having an optical thickness less than 0.25λ−10% and a first material layer having an optical thickness greater than 0.25λ, in which the first region is placed closer to the light emitting structure than the second region.

In the first region, the first material layers may be divided into the first group of first material layers having optical thicknesses greater than 0.25λ+10% and the second group of first material layers having optical thicknesses near 0.25λ, and these groups may be alternately arranged, thereby improving reflection characteristics of the DBR near the central wavelength (λ) and in a spectrum range having longer wavelengths than the central wavelength.

Further, the third region is disposed between the first region and the second region, thereby preventing occurrence of ripples near the center of the spectrum region.

Meanwhile, the structure in which the first region is disposed closer to the light emitting structure than the second region may improve reflection efficiency with respect to incident light in a wide spectrum range because light having a shorter wavelength may more deeply permeate into the DBR than light having a longer wavelength.

Further, the first group of first material layers may include first material layers having optical thicknesses less than 0.3λ−10% and the third group of first material layers may have an optical thickness greater than 0.2λ−10%. The first group of first material layers generally has an optical thickness near 0.3λ, and the third group of first material layers generally has an optical thickness near 0.2λ. Accordingly, the first group of first material layers increases reflectance in a longer wavelength range than the central wavelength and the third group of the first material layers increases reflectance in a shorter wavelength range than the central wavelength.

According to exemplary embodiments, an optical thickness deviation of the first material layers in the first region may be greater than that of the first material layers in the second region. The optical thickness deviation of the first material layers in the first region is increased by clearly dividing the optical thicknesses of the first group of first material layers and the optical thicknesses of the first material layers of the second group.

The second material layers in the first region may include a first group of second material layers having an optical thickness greater than 0.25λ+10% and a second group of second material layers having an optical thickness greater than 0.25λ−10% and less than 0.25λ+10%; the second material layers in the second region may include a third group of second material layers having an optical thickness less than 0.25λ−10% and consecutively arranged; and the second material layers in the third region may include a second material layer having an optical thickness smaller than 0.25λ−10% and a second material layer having an optical thickness greater than 0.25λ and smaller than 0.25λ+10%.

In the first region, the second material layers may be divided into two groups like the first material layers. The second material layers may also include the first group of second material layers and the second group of second material layers, and the first group and the second group may be alternately arranged.

The first group of second material layers may have an optical thickness less than 0.25λ+20%. Furthermore, the first group of second material layers may have a smaller average optical thickness than the first group of first material layers.

In general, material layers having a high refractive index have a higher light absorption rate than material layers having a low refractive index. Accordingly, the optical thickness of the second material layers having a high refractive index may be adjusted to be smaller than that of the first material layers having a low refractive index in order to reduce light loss caused by light absorption. More particularly, in the first region having a relatively greater optical thickness, the thickness of the second material layers may be relatively reduced in order to achieve effective prevention of light loss caused by light absorption.

An optical thickness deviation of the second material layers in the first region may be greater than that of the second material layers in the second region. In the first region, the second material layers may be divided into two groups having different optical thicknesses like the first material layers. On the contrary, in the second region, the second material layers may have a substantially similar optical thickness and thus has a relatively small thickness deviation.

In some exemplary embodiments, the third region may further include second material layers having an optical thickness greater than 0.25λ+10%. In addition, the DBR may further include a first material layer disposed in the third region and having an optical thickness greater than 0.25λ−10% and less than 0.25λ.

The first region may include fewer layers than the first region and the second region. However, the layers in the third region may have more various optical thicknesses than the first region or the second region.

In the exemplary embodiments of the present invention, the light emitting diode may be various types such as a horizontal type, a vertical type, a flip chip type, or the like, but the inventive concepts are not limited to a specific light emitting diode structure.

In addition, the active layer may generate, for example, blue light in some exemplary embodiments. More particularly, the active layer may emit light having a wavelength in the range of 425 nm to 475 nm, for example, blue light having a wavelength that is shorter than the central wavelength (554 nm) by about 100 nm.

As used herein, the terms "the first material layer of a low refractive index" and "the second material layer of a high refractive index" may refer to a relative difference in refractive index between the first material layer and the second material layer. For example, the first material layers of a low refractive index have a lower refractive index than the second material layers of a high refractive index. In one exemplary embodiment, the first material layers may be $SiO_2$ layers and the second material layers may be $TiO_2$ layers. For example, the $SiO_2$ layers may have a refractive index of about 1.47 and the $TiO_2$ layers may have a refractive index of about 2.41. It should be understood that the first material layers and the second material layers are not limited to the $SiO_2$ layers and the $TiO_2$ layers. So long as the first material layers and the second material layers have different refractive indices and are optically transparent, not only insulation layers but also semiconductor layers may be used as the first and second material layers. Here, dielectric layers, such as the $SiO_2$ layers and the $TiO_2$ layers, are more suitable due to high light transmittance, easy deposition, and relatively large difference in refractive index.

Hereinafter, exemplary embodiments of the present invention will be described in more detail with reference to the accompanying drawings.

FIG. 1 is a cross-sectional view illustrating a light emitting diode according to an exemplary embodiment of the present invention.

Referring to FIG. 1, the light emitting diode 100 includes a substrate 21, a light emitting structure 30, an interfacial layer 41, and a DBR 43. The light emitting diode 100 may further include a buffer layer 23, a transparent electrode layer 31, a first electrode pad 33, a second electrode pad 35, a current blocking layer 39, and a surface layer 45.

The substrate 21 may be any transparent substrate without limitation, and may be, for example, a sapphire substrate, a gallium nitride (GaN) substrate or a SiC substrate. The substrate 21 may be a growth substrate suitable for growth of GaN-based compound semiconductor layers. For example, the substrate 21 may have a predetermined pattern formed on an upper surface thereof, such as a patterned sapphire substrate (PSS).

The light emitting structure 30 is disposed on an upper surface of the substrate 21. The light emitting structure 30 includes a first conductivity type semiconductor layer 25, a second conductivity type semiconductor layer 29, and an active layer 27 interposed between the first and second conductivity type semiconductor layers 25, 29. Here, the first conductivity type and the second conductivity type may have opposite conductivities, and the first conductivity type is an n-type and the second conductivity type is a p-type, or vice versa.

The first conductivity type semiconductor layer 25, the active layer 27 and the second conductivity type semiconductor layer 29 may be formed of GaN-based compound semiconductor materials, such as (Al, In, Ga)N. Compositional elements and a composition of the active layer 27 may be determined so that the active layer 27 may emit light having a desired wavelength, for example, UV light or blue light. As shown in the drawings, the first conductivity type semiconductor layer 25 and/or the second conductivity type semiconductor layer 29 may be composed of a single layer, or may have a multilayer structure. In addition, the active layer 27 may have a single quantum well structure or a multi-quantum well structure. Further, the buffer layer 23 may be interposed between the substrate 21 and the first conductivity type semiconductor layer 25.

The semiconductor layers 25, 27, 29 may be formed by MOCVD or MBE, and the first conductivity type semiconductor layer 25 may be subjected to patterning to expose some regions thereof through photolithography and etching.

The transparent electrode layer 31 may be formed on the second conductivity type semiconductor layer 29 using, for example, ITO, ZnO or Ni/Au. The transparent electrode layer 31 has lower specific resistance than the second conductivity type semiconductor layer 29, and thus, may spread electric current. The first electrode pad 33, for example, an n-electrode pad 33, is formed on the first conductivity type semiconductor layer 25, and the second electrode pad 35, for example, a p-electrode pad 35, is formed on the transparent electrode layer 31. As shown in the drawings, the p-electrode pad 35 may be electrically connected to the second conductivity type semiconductor layer 29 through the transparent electrode layer 31.

The current blocking layer 39 is disposed between the electrode pad 35 and the second conductivity type semiconductor layer 29. The current blocking layer 39 may be disposed under the transparent electrode layer 31, or may be disposed on the transparent electrode layer 31. When the current blocking layer 39 is disposed between the transparent electrode layer 31 and the electrode pad 35, the electrode pad 35 may be electrically connected to the transparent electrode layer 31 through an extension (not shown).

The current blocking layer 39 reflects light generated in the active layer 27 and traveling towards the electrode pad 35. The current blocking layer 39 may be formed to have high reflectance with respect to light generated in the active layer 27, and may include a distributed Bragg reflector (DBR), in which dielectric layers having different refractive indices, for example, $TiO_2$ layers and $SiO_2$ layers, are alternately stacked one above another. This structure may prevent light loss due to absorption of light by the electrode pad 35, thereby improving luminous efficacy of the light emitting diode 100.

The DBR 43 is disposed on a lower side of the substrate 21. In particular, the substrate 21 is interposed between the light emitting structure 30 and the DBR 43. The DBR 43 is formed by alternately stacking first material layers having a first refractive index (low refractive index), for example, $SiO_2$ layers (n: about 1.47), and second material layers having a second refractive index (high refractive index), for example, $TiO_2$ layers (n: about 2.41). The first material layers and the second material layers may be formed in the same chamber using electron beam evaporation or a plasma ion assisted deposition apparatus. In particular, high-density dense layers may be formed by using the plasma ion assisted deposition apparatus. In addition, characteristics of a thin layer may be changed by controlling a deposition rate, a pressure of the chamber, a temperature of the substrate, a gas injection amount, a bias voltage, and the like of the first material layers and the second material layers in the plasma ion assisted deposition apparatus. In particular, heating of the substrate and the plasma ion assist may change a microstructure of the $TiO_2$ thin layer densely, so as to change tensile stress into compressive stress. The stack structure of the DBR 43 will be described below in more detail with reference to FIG. 7.

The interfacial layer 41 may be interposed between the substrate 21 and the DBR 43. The interfacial layer 41 is formed of a material layer having a lower refractive index than the first material layer. When the first material layer is $SiO_2$, the interfacial layer 41 may be a $MgF_2$ layer, for example. $MgF_2$ has a refractive index of about 1.38. The interfacial layer 41 serves to prevent the DBR 43 formed on the bottom surface of the substrate 21 from being affected by the surface state of the bottom surface of the substrate 21, and is thicker than the first material layers. For example, the interfacial layer 41 may have a thickness of 300 nm to 500 nm, specifically 400 nm.

$MgF_2$ may be formed using, for example, an electron beam evaporation method or a plasma ion assisted deposition method. In an exemplary embodiment, even when $MgF_2$ is deposited using the plasma ion assisted deposition apparatus, $MgF_2$ may be deposited without using the plasma ion assist to mitigate the stress of $MgF_2$. Further, during the deposition of $MgF_2$, optical characteristics of the $MgF_2$ thin layer may be changed using a deposition rate, a chamber pressure, a substrate temperature, a gas injection amount, a bias voltage, and the like.

Further, the surface layer 45 may be formed as the uppermost layer of the DBR 43 so as to cover the DBR 43. The surface layer 45 relieves influence on the DBR 43 by a surface state of a mounting plane, on which the light emitting diode 100 is mounted, upon packaging of the light emitting diode 100. The surface layer 45 is formed to have a relatively thick thickness, similar to that of the interfacial layer 41. For example, the surface layer 45 may be formed of $SiO_2$ having a thickness of 300 to 500 nm, specifically 400 nm.

In the illustrated exemplary embodiment, the DBR 43 is disposed opposite to the light emitting structure 30 with the substrate 21 interposed therebetween. Light generated in the active layer 27 is reflected by the DBR 43 and may be emitted upwards from the light emitting diode 100.

According to an exemplary embodiment, the interfacial layer 41 has a lower refractive index than the first material layers of a low refractive index. The substrate 21 and the interfacial layer 41 generally have different refractive indices, and thus, a total internal reflection occurs at the interface between them.

Figure 2:
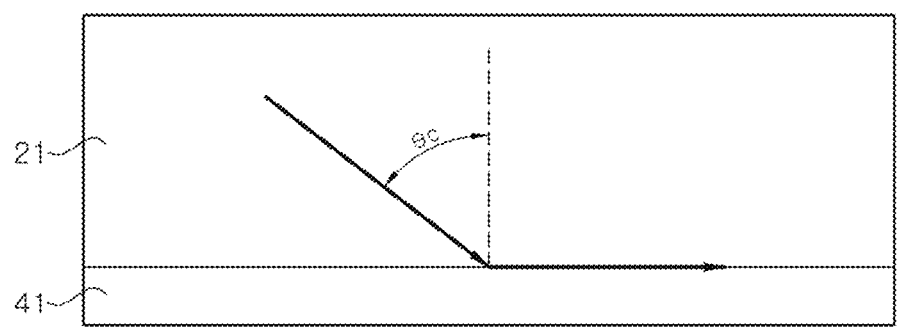
FIG. 2 is a schematic view illustrating a critical angle of light incident on an interfacial layer from a substrate.

FIG. 2 is a schematic view illustrating a critical angle θc of light incident on an interfacial layer from a substrate.

Referring to FIG. 2, the substrate 21 used for growing a gallium nitride based semiconductor layer has a refractive index generally higher than that of the first material layers. For example, the sapphire substrate 21 has a refractive index of about 1.68, and the $SiO_2$ has a refractive index of about 1.47. A SiC substrate or a gallium nitride substrate has a higher refractive index than the sapphire substrate.

Accordingly, light incident on the interfacial layer 41 from the substrate 21 has a critical angle θc, and light incident at an angle greater than the critical angle is totally internal-reflected. In particular, as a difference of the refractive indices between the substrate 21 and the interfacial layer 41 is greater, the critical angle becomes smaller, and thus, an amount of light totally internal-reflected is increased. That is, when the interfacial layer is formed of a material layer having a refractive index lower than that of the first material layer, as compared with a case where the interfacial layer 41 is formed of the same material layer as the first material layer, the total internal reflection may be increased. Accordingly, an amount of light lost due to light absorption in the interfacial layer 41 and the DBR 43 may be reduced. For example, when a $SiO_2$ interfacial layer is used for the sapphire substrate, the critical angle is about 61.7 degrees, whereas when using an $MgF_2$ interfacial layer, the critical angle is about 55.7 degrees, which is lower than when the $SiO_2$ interfacial layer is used by about 6 degrees.

In particular, the DBR 43 generally has a relatively high reflectance for vertically incident light, and a relatively low reflectance for light having a large incident angle. Therefore, light incident on the DBR 43 with the large incident angle may be lost in the DBR 43. However, according to an exemplary embodiment, light having the large incident angle can be blocked from entering the DBR 43 using total internal reflection by the interfacial layer 41, thereby reducing light loss.

Figure 3:
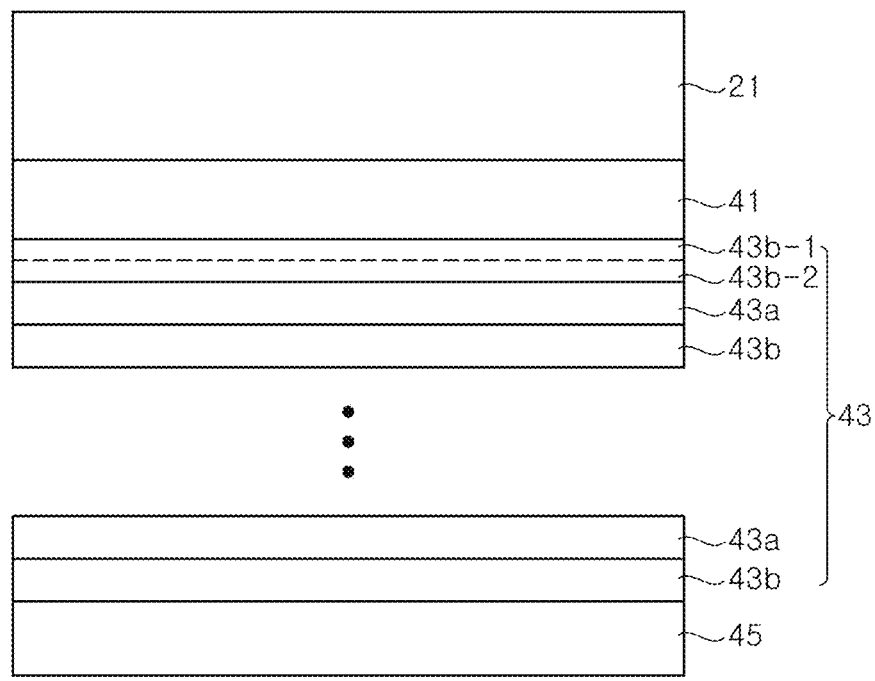
FIG. 3 is a partially enlarged cross-sectional view of a light emitting diode according to an exemplary embodiment of the present invention.

FIG. 3 is a partially enlarged cross-sectional view of a light emitting diode according to an exemplary embodiment of the present invention.

Referring to FIG. 3, the DBR 43 has a structure, in which first material layers 43b having low refractive index and second material layers 43a having high refractive index are alternately stacked one above another. The interfacial layer 41 is interposed between the substrate 21 and the DBR 43.

The interfacial layer 41 may be subjected to tensile stress by the substrate 21. The interfacial layer 41 subjected to the tensile stress may be formed, by being deposited without the plasma ion assist in the plasma ion assist apparatus, for example. Meanwhile, the DBR 43 is generally formed at a relatively high density so as to maintain a high refractive index, and thus, is subjected to compressive stress by the substrate 21. A difference in stress between the interfacial layer 41 and the DBR 43 may cause peeling of the DBR 43.

In order to prevent peeling between the interfacial layer 41 and the DBR 43, according to an exemplary embodiment, at least a first layer of second material layers 43b of the DBR 43, that is, a second material layer closest to the interfacial layer 41 includes a first sub-layer 43b-1 having a relatively low density and a second sub-layer 43b-2 having a relatively high density. For example, the first sub-layer 43b-1 may be deposited without the plasma ion assist in the plasma ion assist apparatus, and the second sub-layer 43b-2 may be deposited using the plasma ion assist. In addition, a density of the first material layer may be adjusted by controlling a deposition rate, a pressure of the chamber, a temperature of the substrate, a gas injection amount, a bias voltage, and the like. Meanwhile, since the first sub-layer 43b-1 has a relatively low density, it is possible to reduce the total compressive stress of the first layer of the second material layers 43b, thereby preventing the DBR 43 from being peeled off from the interfacial layer 41. For example, the second material layers 43b may be formed of $TiO_2$, and the first sub-layer 43b-1 may be formed of a relatively low density $TiO_2$ layer and the second sub-layer 43b-2 may be formed of a relatively high density $TiO_2$ layer.

The first sub-layer 43b-1 may be disposed closer to the interfacial layer 41 than the second sub-layer 43b-2, and the first sub-layer 43b-1 may further contact the interfacial layer 41, without being limited thereto. By placing the first sub-layer 43b-1 between the second sub-layer 43b-2 and the interfacial layer 41, a difference in stress between the DBR 43 and the interfacial layer 41 is reduced, thereby preventing peeling of the DBR 43.

A thickness of the first sub-layer 43b-1 and a thickness of the second sub-layer 43b-2 may greatly affect the peeling of the DBR 43. The second material layer 43b in contact with the interfacial layer 41 has a thickness of about 50 nm, which may reduce the peeling by forming the first sub-layer 43b-1. However, when the first sub-layer 43b-1 is not thick enough, the peeling of the DBR 43 may still occur. In order to make the first sub-layer 43b-1 sufficiently thick, a thickness of the first sub-layer 43b-1 may be about ⅓ or more of the thickness of the second material layer 43b. For example, the thickness of the first sub-layer 43b-1 may be greater than or equal to 15 nm, and further may be greater than or equal to about 25 nm. When the thickness of the first sub-layer 43b-1 is 5 nm, the peeling of the DBR 43 was observed, but the peeling of the DBR 43 was not observed when the thickness of the first sub-layer 43b-1 is 25 nm.

Each of the second material layers 43b other than the second material layer 43b contacting the interfacial layer 41 may be formed as a single layer having the same density as that of the second sub-layer 43b-1. However, the inventive concepts are not limited thereto, and some of these layers may include sub-layers having different densities. However, since a low-density material layer may introduce moisture or the like during the operation of the light emitting diode to change the reflection wavelength band, use of the low-density sub-layers may be limited. For example, more than half of the total number of layers of second material layers 43b is formed of a high-density material layer without sub-layers.

In an exemplary embodiment, when the current blocking layer 39 is formed of a distributed Bragg reflector, an interfacial layer (not shown) is formed between the distributed Bragg reflector and the second conductivity type semiconductor layer 29. In this case, the interfacial layer may have a lower refractive index than that of a low refractive index layer in the distributed Bragg reflector. Therefore, as compared to a case where the interfacial layer having the same refractive index as that of the low refractive index layer in the distributed Bragg reflector, the total internal reflection may be increased and the optical loss may be reduced. In addition, as described above, the second material layer of a high refractive index in contact with the interfacial layer in the current blocking layer 39 may include the first sub-layer having the relatively low density and the second sub-layer having the relatively high density.

Figure 4:
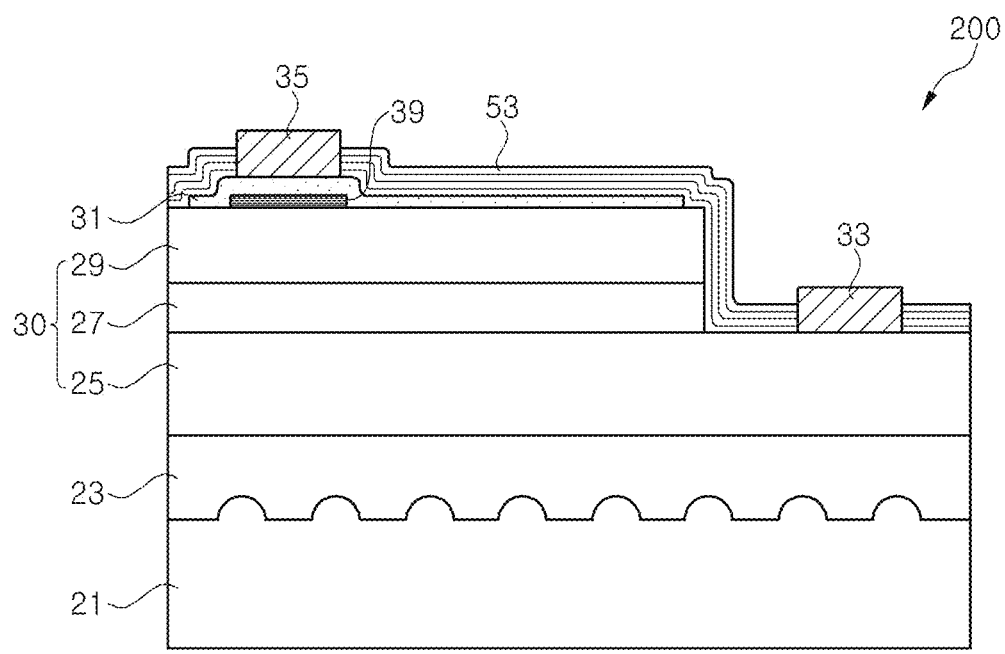
FIG. 4 is a cross-sectional view illustrating a light emitting diode according to another exemplary embodiment of the present invention.

FIG. 4 is a schematic cross-sectional view of a light emitting diode according to another exemplary embodiment of the present invention.

Referring to FIG. 4, a DBR 53 of a light emitting diode 200 is generally similar to the DBR 43 of FIG. 3, except that the DBR 53 is disposed on the light emitting structure 30 opposite to the substrate 21. As shown in the drawing, the DBR 53 may cover the transparent electrode layer 31, and may cover an exposed surface of the first conductivity type semiconductor layer 25. The DBR 53 reflects light generated in the active layer 27 towards the substrate 21. A specific structure of the DBR 53 is substantially the same as that of the DBR 43 described above. An interfacial layer may also be disposed between the light emitting structure 30 and the DBR 53, and a surface layer may be disposed on an upper surface of the DBR 53, in some exemplary embodiments. The interfacial layer and the surface layer are substantially the same as the interfacial layer 41 and the surface layer 45 described above, respectively, and thus detailed descriptions thereof will be omitted to avoid redundancy.

The light emitting diode 200 may be, for example, a flip-chip type light emitting diode. Therefore, shapes and locations of the transparent electrode layer 31, an n-electrode pad 33, and a p-electrode pad 35 may be modified to be suited for the flip-chip type light emitting diode.

Figure 5A:
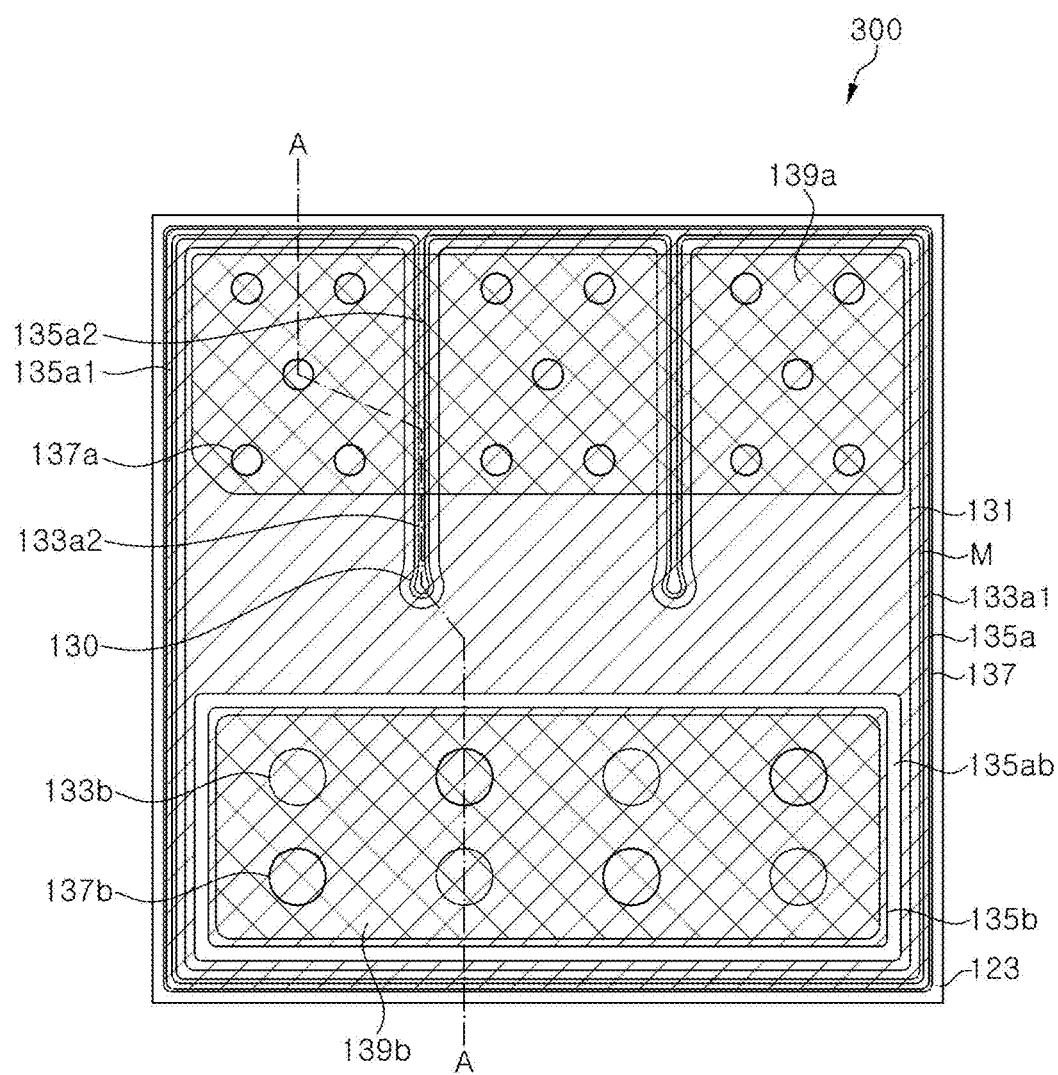
FIGS. 5A and 5B are a plan view and a cross-sectional view illustrating a light emitting diode according to another exemplary embodiment of the present invention.
Figure 5B:
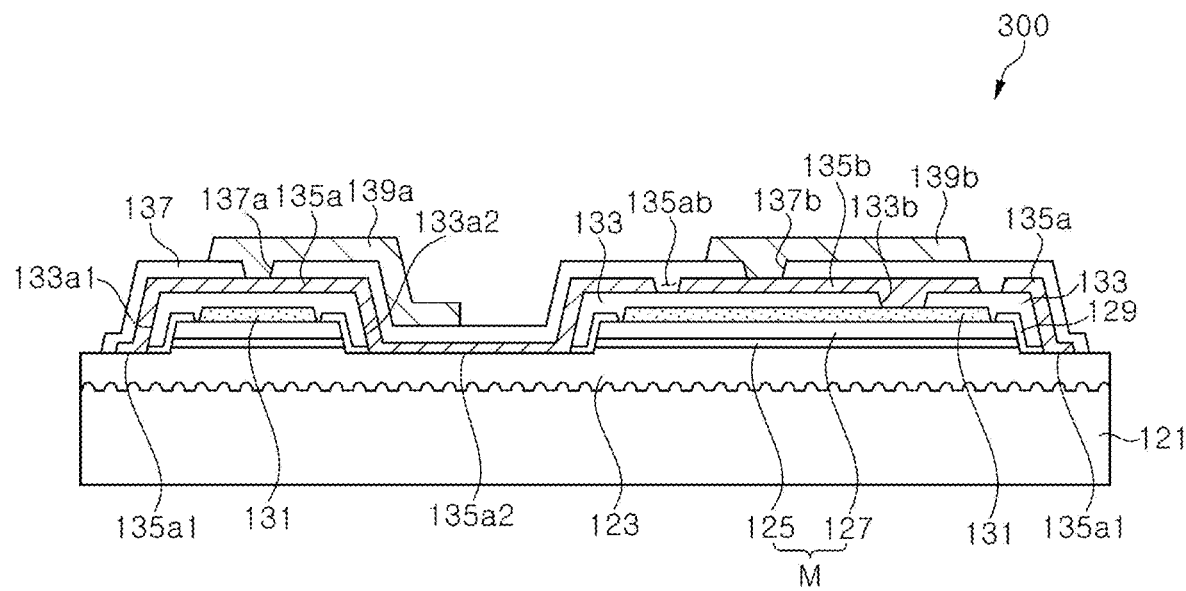

FIG. 5 is a schematic plan view of a light emitting diode according to another exemplary embodiment of the present invention, and FIG. 5A is a schematic cross-sectional view of a light emitting diode of FIG. 5, and FIG. 5B is a cross-sectional view taken along line A-A of FIG. 5A.

Referring to FIGS. 5A and 5B, the light emitting diode 300 includes a substrate 121, a first conductivity type semiconductor layer 123, an active layer 125, a second conductivity type semiconductor layer 127, an ohmic reflection layer 131, a lower insulation layer 133, a first pad metal layer 135a, a second pad metal layer 135b, and an upper insulation layer 137. Moreover, the light emitting diode may further include a preliminary insulation layer 129, and may further include a first bump pad 139a and a second bump pad 139b.

The substrate 121 may be substantially the same as the substrate 21 described with reference to FIG. 1. In particular, the substrate 121 may be, for example, a sapphire substrate, a gallium nitride substrate, a SiC substrate, or the like, and may be a patterned sapphire substrate. The substrate 121 may have a substantially rectangular or square shape as shown in FIG. 5A, but the inventive concepts are not limited thereto. A size of the substrate 121 is not particularly limited and may be variously selected.

The first conductivity type semiconductor layer 123 is disposed on the substrate 121. The first conductivity type semiconductor layer 123 may be a layer grown on the substrate 121, and may be a gallium nitride semiconductor layer. The first conductivity type semiconductor layer 123 may be a gallium nitride-based semiconductor layer doped with an impurity, for example, Si. A buffer layer 23 described with reference to FIG. 1 may be interposed between the first conductivity type semiconductor layer 123 and the substrate 121.

A mesa M is disposed on the first conductivity type semiconductor layer 123. The mesa M may be disposed within a region surrounded by the first conductivity type semiconductor layer 123, so that regions near edges of the first conductivity type semiconductor layer 123 are not covered by the mesa M, but exposed to the outside.

The mesa M includes the second conductivity type semiconductor layer 127 and the active layer 125. The active layer 125 is interposed between the first conductivity type semiconductor layer 123 and the second conductivity type semiconductor layer 127. The active layer 125 may have a single quantum well structure or a multiple quantum well structure. A composition and a thickness of the well layer in the active layer 125 determine a wavelength of generated light. In particular, by controlling the composition of the well layer, it is possible to provide an active layer generating ultraviolet light, blue light, or green light.

The second conductivity type semiconductor layer 127 may be a gallium nitride semiconductor layer doped with p-type dopants, for example, Mg. Each of the first conductivity type semiconductor layer 123 and the second conductivity type semiconductor layer 127 may be composed of a single layer or multiple layers, and may include super-lattice layers. The first conductivity type semiconductor layer 123, the active layer 125, and the second conductivity type semiconductor layer 127 may be grown on the substrate in a chamber by a well-known method, such as metal organic chemical vapor deposition (MOCVD).

As shown in FIG. 5A, the mesa M may have an indent portion 130 intruding therein, and an upper surface of the first conductivity type semiconductor layer 123 may be exposed by the indent portion 130. The indent portion 130 may be formed longitudinally from one side edge of the mesa M toward the other side opposite to the mesa M. In the illustrated exemplary embodiment, it is described that the mesa M has the indent portion 130, but in some exemplary embodiments, the mesa M may have a substantially rectangular shape as similar to the substrate 21, and may be formed to have a through hole(s) exposing the first conductivity type semiconductor layer 123, for example.

A length of the indent portion 130 is not particularly limited, and may be ½ of the length of the mesa M or greater in some exemplary embodiments. Also, although two indent portions 130 are shown in FIG. 5A, the inventive concepts are not limited to a particular number of indent portions 130, and the number of indent portion 130 may be one or three or more in some exemplary embodiments. Accordingly, as the number of indent portions 130 increases, the number of inner contact portions 135a2 of the first pad metal layer 135a is increased, thereby improving current spreading capability.

Meanwhile, the indent portion 130 has a round shape to have a wider end near an end terminal portion thereof. As such, the lower insulation layer 133 may be formed to have a similar shape as the indent portion 130. In particular, when the lower insulation layer 133 includes a distributed Bragg reflector, if a width of the indent portion 130 is not widened at the end terminal portion as shown in FIG. 5A, a severe double step may be formed in a side wall of the distributed Bragg reflector, and the pad metal layer 135a is likely to be cracked as an inclination angle of the side wall becomes large. Accordingly, the lower insulation layer 133 may be formed to have a gentle inclination angle by forming the shape of the end terminal portion of the indent portion 130 and the shape of the end terminal portion of a first opening 133a2 of the lower insulation layer 133 as shown in FIGS. 5A and 5B, thereby improving yield of the light emitting diode.

The ohmic reflection layer 131 is disposed over the mesa M to contact the second conductivity type semiconductor layer 127. The ohmic reflection layer 131 may be disposed substantially over an entire area of the mesa M in an upper region of the mesa M. For example, the ohmic reflection layer 131 may cover 80% or more, further, 90% or more of the upper region of the mesa M.

The ohmic reflection layer 131 may include a metal layer having reflectivity, and thus, can reflect light generated from the active layer 125 and travelling to the ohmic reflection layer 131, towards the substrate 121. For example, the ohmic reflection layer 131 may be composed of a single reflection metal layer, but is not limited thereto. Alternatively, the ohmic reflection layer 131 may include an ohmic layer and a reflection layer. The ohmic layer may be a metal layer, such as a Ni layer, or a transparent oxide layer, such as an ITO layer, and the reflection layer may be a metal layer having high reflectance, such as an Ag or Al layer.

The preliminary insulation layer 129 may cover the mesa M in a periphery of the ohmic reflection layer 131. The preliminary insulation layer 129 may be formed of $SiO_2$, and may cover a side of the mesa M and a partial region of the first conductivity type semiconductor layer 123. In some exemplary embodiments, the preliminary insulation layer 129 may be disposed only on the periphery of the ohmic reflection layer 131 in the upper region of the mesa M.

The lower insulation layer 133 covers the mesa M and the ohmic reflection layer 131. The lower insulation layer 133 may also cover the first conductivity type semiconductor layer 123 along a periphery of the mesa M, and may cover the first conductivity type semiconductor layer 123 in the indent portion 130 inside the mesa M. The lower insulation layer 133 covers side surfaces of the mesa M.

Meanwhile, the lower insulation layer 133 has first openings 133a1 and 133a2 exposing the first conductivity type semiconductor layer 123 and a second opening 133b exposing the ohmic reflection layer 131. The first opening 133a1 exposes the first conductivity type semiconductor layer 123 along the periphery of the mesa M, and the first opening 133a2 exposes the first conductivity type semiconductor layer 123 in the indent portion 130. As shown in FIG. 5A, the first openings 133a1 and 133a2 may be connected to each other. However, the inventive concepts are not limited thereto, and the first openings 133a1 and 133a2 may be separated from each other.

The second opening 133b exposes the ohmic reflection layer 131. A plurality of second openings 133b may be formed, and these second openings 133b may be disposed near one edge of the substrate 121 to face the indent portion 130. Locations of the second openings 133b will be described in more detail later.

Meanwhile, the lower insulation layer 133 covers the preliminary insulation layer 129 and is integrated with the preliminary insulation layer 129. Hereinafter, unless otherwise stated, the preliminary insulation layer 129 will be described as being included in the lower insulation layer 133. The lower insulation layer 133 includes a distributed Bragg reflector (DBR), in which first material layers of a low refractive index and second material layers of a high refractive index are alternately stacked one above another as described above, and may further include an interfacial layer. The interfacial layer may be disposed under the DBR and may be disposed on the ohmic reflection layer 131 and the preliminary insulation layer 129.

A second material layer in contact with the interfacial layer may include a first sub-layer having a relatively low density and a second sub-layer having a relatively high density as described above, and thus, repeated descriptions thereof will be omitted to avoid redundancy.

In addition, the lower insulation layer 133 may include a surface layer disposed on the DBR. Since the surface layer is similar to the surface layer 45 described with reference to FIG. 1, repeated descriptions thereof will be omitted to avoid redundancy.

The first pad metal layer 135a is disposed on the lower insulation layer 133 and is insulated from the mesa M and the ohmic reflection layer 131 by the lower insulation layer 133. The first pad metal layer 135a contacts the first conductivity type semiconductor layer 123 through the first openings 133a1 and 133a2 of the lower insulation layer 133. The first pad metal layer 135a may include an outer contact portion 135a1 contacting the first conductivity type semiconductor layer 123 along the periphery of the mesa M, and an inner contact portion 135a2 contacting the first conductivity type semiconductor layer 123 in the indent portion 130. The outer contact portion 135a1 contacts the first conductivity type semiconductor layer 123 near an edge of the substrate 121 along the periphery of the mesa M, and the inner contact portion 135a2 contacts the first conductivity type semiconductor layer 123 in a region surrounded by the outer contact portion 135a1. The outer contact portion 135a1 and the inner contact portion 135a2 may be connected to each other, but the inventive concepts are not limited thereto, and they may be separated from each other in some exemplary embodiments.

The second pad metal layer 135b is disposed on the upper region of the mesa M on the lower insulation layer 133, and is electrically connected to the ohmic reflection layer 131 through the second opening 133b of the lower insulation layer 133. The second pad metal layer 135b may be surrounded by the first pad metal layer 135a, and a boundary region 135ab may be formed therebetween. The lower insulation layer 133 is exposed in the boundary region 135ab, and the boundary region 135ab is covered with the upper insulation layer 137, which will be described in more detail later.

The first pad metal layer 135a and the second pad metal layer 135b may be formed of substantially the same material by the same process. The first and second pad metal layers 135a and 135b may include an ohmic reflection layer 131, such as an Al layer, and the ohmic reflection layer 131 may be formed on an adhesive layer, such as Ti, Cr, or Ni. Furthermore, a protective layer of a single layer or a multiple layer structure, such as Ni, Cr, Au, or others may be formed on the ohmic reflection layer 131. The first and second pad metal layers 35a and 35b may have multilayer structures of Cr/Al/Ni/Ti/Ni/Ti/Au/Ti, for example.

The upper insulation layer 137 covers the first and second pad metal layers 135a and 135b. In addition, the upper insulation layer 137 may cover the first conductivity type semiconductor layer 123 along the periphery of the mesa M. However, in some exemplary embodiments, the upper insulation layer 137 may expose the first conductivity type semiconductor layer 123 along the edge of the substrate 121.

Meanwhile, the upper insulation layer 137 has a first opening 137a exposing the first pad metal layer 135a and a second opening 137b exposing the second pad metal layer 135b. The first opening 137a and the second opening 137b may be disposed in the upper region of the mesa M, and may be arranged to face each other. In particular, the first opening 137a and the second opening 137b may be disposed near both side edges of the mesa M.

The second opening 133b of the lower insulation layer 133 described above may be disposed near the second opening 137b of the upper insulation layer 137. However, the second opening 133b of the lower insulation layer 133 is separated from the first opening 137a of the upper insulation layer 137 and from the second opening 137b of the upper insulation layer 137 not to overlap with each other. Accordingly, even if a solder intrudes through the second opening 137b of the upper insulation layer 137, it is possible to prevent the solder from diffusing into the second opening 133b of the lower insulation layer 133, thereby preventing the contamination of the ohmic reflection layer 131 by the solder.

The upper insulation layer 137 may be formed of a single layer of $SiO_2$ or $Si_3N_4$, without being limited thereto. For example, the upper insulation layer 137 may have a multilayer structure of a silicon oxide layer and a silicon nitride layer, and may include a distributed Bragg reflector, in which silicon oxide layers and titanium oxide layers are alternately stacked one above another. In addition, when the upper insulation layer 137 includes a distributed Bragg reflector, the interfacial layer described above may be disposed under the distributed Bragg reflector, and further, the surface layer may be disposed on an upper surface of the distributed Bragg reflector.

The first bump pad 139a electrically contacts the first pad metal layer 135a exposed through the first opening 137a of the upper insulation layer 137, and the second bump pad 139b electrically contacts the second pad metal layer 135b exposed through the second opening 137b. As shown in FIG. 5A, the first bump pad 139a covers and seals all of the first openings 137a of the upper insulation layer 137, and the second bump pad 139b covers and seals all of the second openings 137b of the upper insulation layer 137. Further, the second bump pad 139b covers an upper region of the second opening 133b of the lower insulation layer 133. That is, the second bump pad 139b covers the upper insulation layer 137 in the upper region of the second opening 133b of the lower insulation layer 133. The second bump pad 139b may cover all of the second openings 133b of the lower insulation layer 133, but the inventive concepts are not limited thereto, and a portion of the openings 133b may be disposed outside of the second bump pad 139b in some exemplary embodiments.

Further, as shown in FIG. 5A, the second bump pad 139b may be disposed within an upper region of the second pad metal layer 135a, but the inventive concepts are not limited thereto, and a portion of the second bump pad 139b may overlap with the first pad metal layer 135a in some exemplary embodiments. In this case, the upper insulation layer 137 may be disposed between the first pad metal layer 135a and the second bump pad 139b to insulate them.

Figure 6:
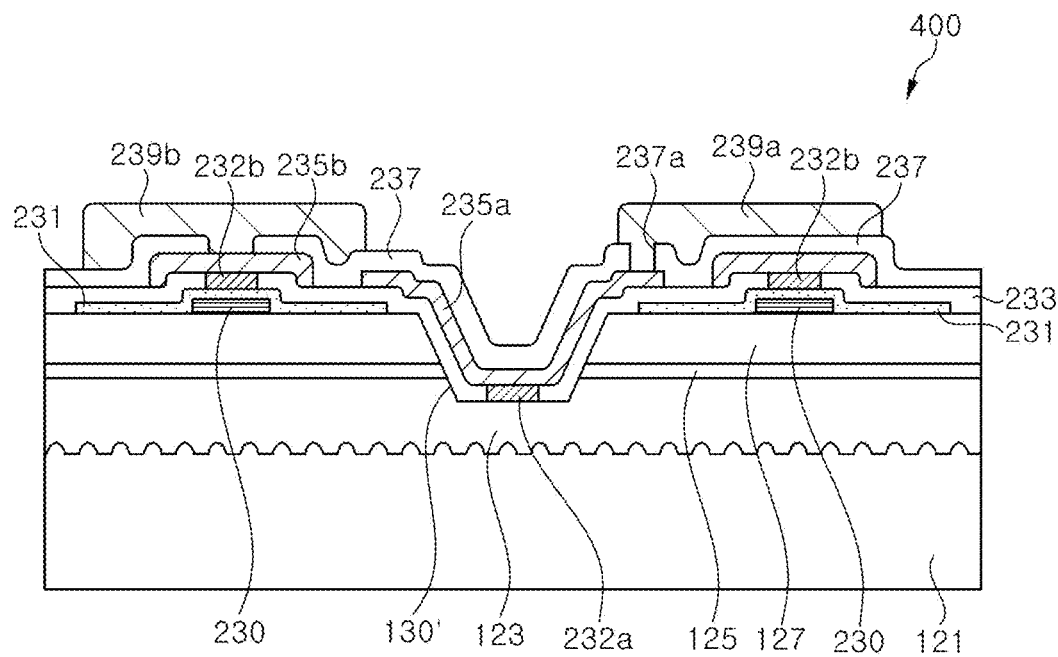
FIG. 6 is a cross-sectional view illustrating a light emitting diode according to another exemplary embodiment of the present invention.

FIG. 6 is a cross-sectional view of a light emitting diode according to another exemplary embodiment of the present invention.

Referring to FIG. 6, the light emitting diode 400 according to an exemplary embodiment includes a substrate 121 and a light emitting structure similar to the light emitting diode 300 described with reference to FIGS. 5A and 5B. The light emitting structure includes a first conductivity type semiconductor layer 123, an active layer 125, and a second conductivity type semiconductor layer 127. The substrate 121, the first conductivity type semiconductor layer 123, the active layer 125, and the second conductivity type semiconductor layer 127 are substantially similar to those described with reference to FIGS. 5A and 5B, and thus, detailed descriptions thereof will be omitted to avoid redundancy. The active layer 125 and the second conductivity type semiconductor layer 127 may be arranged in a mesa shape on the first conductivity type semiconductor layer 123, but the inventive concepts are not limited thereto. For example, outline edges of the active layer 125 and the second conductivity type semiconductor layer 127 may substantially coincide with an outline edge of the first conductivity type semiconductor layer 123.

The light emitting structure may further include the indent portion 130 as described with reference to FIGS. 5A and 5B, but the inventive concepts are not limited thereto. The light emitting structure may include a plurality of vias 130' exposing the first conductivity type semiconductor layer 123. Further, the light emitting structure may include both the indent portion 130 and the vias 130' in some exemplary embodiments. In addition, the first conductivity type semiconductor layer 123 may be exposed only to an outer region of the mesa without the indent portion 130 or the vias 130' in some exemplary embodiments.

A first electrical connection layer 232a may be formed on the exposed first conductivity type semiconductor layer 123, and the first electrical connection layer 232a is in ohmic contact with the first conductivity type semiconductor layer 123. In some exemplary embodiments, the first electrical connection layer 232a may be omitted.

The light emitting diode 400 includes a transparent electrode layer 231 as a contact layer to be in ohmic contact with the second conductivity type semiconductor layer 127, instead of the ohmic reflection layer 131. Since the transparent electrode layer 231 is substantially similar to the transparent electrode layer 31 described with reference to FIG. 1, the detailed descriptions thereof will be omitted. In addition, a current blocking layer 230 may be interposed between the transparent electrode layer 231 and a second conductivity type semiconductor layer 237. Since the current blocking layer 230 is substantially similar to the current blocking layer 39 described with reference to FIG. 1, the detailed descriptions thereof will be omitted.

Meanwhile, an electric connection layer 232b connected to the transparent electrode layer 231 may be disposed in an upper region of the current blocking layer 230. A plurality of electric connection layers 232 may be disposed and connected to the transparent electrode layer 231 in a plurality of regions. The electric connection layer 232b may have an elongated linear shape or a dotted shape. The shape of the current blocking layer 230 may correspond to a shape of the region where the electric connection layer 232b is connected to the transparent electrode layer 231. Accordingly, the current blocking layer 230b may be arranged in the linear shape or the dotted shape. The electric connection layer 232b may be formed of substantially the same material as an electric connection layer 232a in the same process, but the inventive concepts are not limited thereto. The electric connection layer 232b may protect the transparent electrode layer 231 during a process of patterning a lower insulation layer 233. In some exemplary embodiments, the electric connection layer 232b may be omitted.

The lower insulation layer 233 covers the transparent electrode layer 231 and the light emitting structure. The lower insulation layer 233 also covers the vias 130' exposing the first conductivity type semiconductor layer 123. However, the lower insulation layer 233 exposes the electric connection layer 232a formed on the first conductivity type semiconductor layer 123, for example, the electric connection layer 232a in the vias 130', and also exposes the electric connection layer 232b on the insulation layer 231. When the electric connection layers 232a and 232b are omitted in some exemplary embodiments, the lower insulation layer 233 may expose the first conductivity type semiconductor layer 123 and the transparent electrode layer 231.

The lower insulation layer 233 may include a DBR and an interfacial layer as described above with reference to FIGS. 5A and 5B, and may further include a surface layer.

A first pad metal layer 235a and a second pad metal layer 235b are disposed on the lower insulation layer 233, and are electrically connected to the first conductivity type semiconductor layer 123 and the transparent electrode layer 231. The first pad metal layer 235a and the second pad metal layer 235b may be connected to the electric connection layers 232a and 232b exposed through the lower insulation layer 233, respectively.

The first pad metal layer 235a and the second pad metal layer 235b may be disposed one for each of the light emitting diode, but the inventive concepts are not limited thereto. For example, a plurality of first pad metal layers 235a and/or a plurality of the second pad metal layers 235b may be disposed for each light emitting diode.

An upper insulation layer 237 covers the first and second pad metal layers 235a and 235b, and has openings 237a and 237b exposing the first and second pad metal layers 235a and 235b. Since the upper insulation layer 237 is substantially similar to the upper insulation layer 137 described above with reference to FIGS. 5A and 5B, detailed descriptions thereof will be omitted to avoid redundancy.

A first bump pad 239a and a second bump pad 239b are disposed on the upper insulation layer 237, and are connected to the first and second pad metal layers 235a and 235b through the openings 237a and 237b. When the first pad metal layers 235a are formed in plural, the first bump pads 239a electrically connects the first pad metal layers 235a. In addition, when the second pad metal layers 235b are formed in plural, the second bump pads 239b may electrically connect the second pad metal layers 235b.

Although various exemplary embodiments of the light emitting diode are described above, the inventive concepts are not limited to the illustrated exemplary embodiments. The light emitting diode described above may also be variously modified, and may be applied to modified light emitting diodes and various other light emitting diodes.

Hereinafter, a DBR structure for increasing the reflectance will be described in more detail according to exemplary embodiments. However, the inventive concepts are not limited to the following DBR structure described below.

Figure 7:
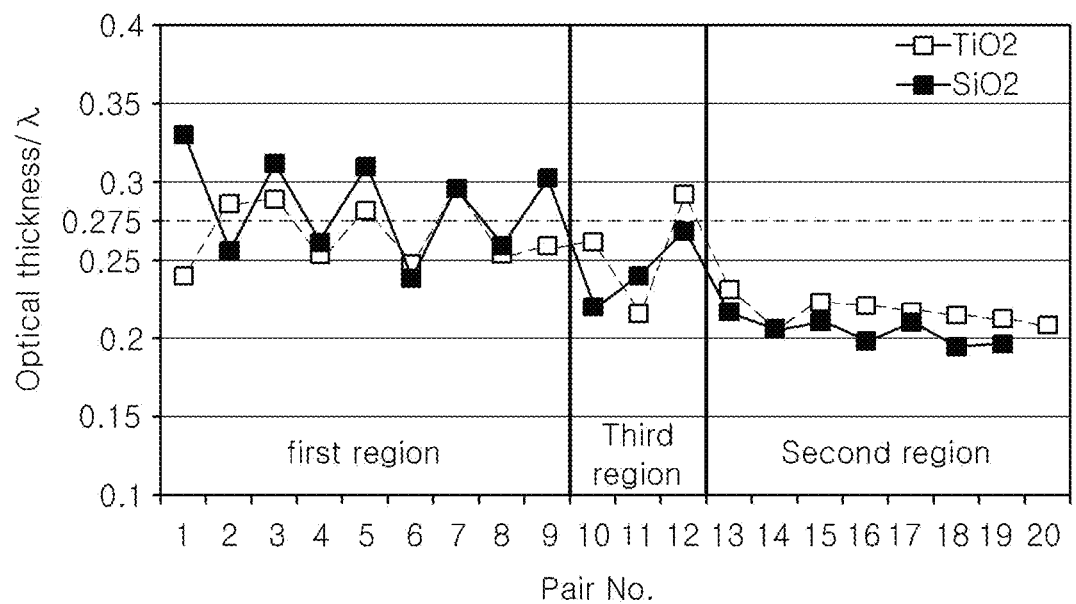
FIG. 7 is a graph depicting optical thicknesses of TiO$_2$/SiO$_2$ pairs depending upon locations for illustrating a DBR structure according to an exemplary embodiment of the present invention.

FIG. 7 is a graph depicting optical thicknesses of $TiO_2$/$SiO_2$ pairs depending upon location for illustrating a DBR structure according to an exemplary embodiment of the present invention. As used herein, the optical thickness refers to a thickness with respect to a central wavelength (k: 554 nm) in the visible range.

Hereinafter, a first material layer will be described as having a lower refractive index than that of a second material layer. Further, although the DBR 43 of FIG. 1 is described as an example, the DBR described below may be applied to DBRs of various exemplary embodiments as discussed above.

A first layer of the DBR 43 may be the first material layer or the second material layer. However, since an interfacial layer having a lower refractive index than that of the first material layer is used, the first layer of the DBR 43 formed on the interfacial layer is described as the second material layer. However, the inventive concepts are not limited thereto, and the first material layer may be the first layer.

The surface layer 45 formed on the surface of the DBR 43 has a relatively large thickness so as to protect the DBR 43, and may be formed of substantially the same material as the first material layer. Accordingly, the last layer of the DBR 43 excluding the surface layer 45 is generally the second material layer, and may not be formed in a pair.

FIG. 7 shows the DBR 43 interposed between the interfacial layer 41 and the surface layer 45, in which the first layer and the last layer of the DBR 43 are the second material layers ($TiO_2$ layers). Accordingly, a pair is formed in the order of the second material layer ($TiO_2$ layer)/the first material layer ($SiO_2$ layer), and the last second material layer does not form a pair.

Referring to FIG. 7, it can be confirmed that the structure of the DBR is divided into a first region, a second region, and a third region. Here, the first region is placed closer to the light emitting structure 30 than the second region, and the third region is interposed between the first region and the second region.

(First Region)

The first region is provided to increase reflectance near the central wavelength (k) and in a spectrum region having a longer wavelength than the central wavelength (k). Accordingly, the first material layers and the second material layers in the first region generally have an optical thickness near $0.25\lambda$ or greater than $0.25\lambda$.

Specifically, in the first region, the first material layers ($SiO_2$ layers) are divided into a first group of first material layers having an optical thickness greater than $0.25\lambda+10\%$ and a second group of first material layers having an optical thickness greater than $0.25\lambda-10\%$ and smaller than $0.25\lambda+10\%$. The first group of first material layers and the second group of first material layers are alternately arranged. As shown in FIG. 7, the first group of first material layers having a relatively large thickness and the second group of first material layers having a relatively small thickness are alternately arranged. The first group of first material layers may be formed prior to the second group of first material layers, or vice versa.

Furthermore, the first group of first material layers generally has an optical thickness smaller than $0.3\lambda+10\%$. In the illustrated exemplary embodiment, it is seen that the first group of first material layers includes five first material layers, and four layers excluding the first layer in the first group have an optical thickness smaller than $0.3\lambda+10\%$.

Meanwhile, the second material layers in the first region (for example, $TiO_2$ layers) include a first group of second material layers having an optical thickness greater than $0.25\lambda+10\%$ and a second group of second material layers having an optical thickness greater than $0.25\lambda-10\%$ and smaller than $0.25\lambda+10\%$.

The optical thickness of the first group of second material layers is distinguished from the optical thickness of the second group of second material layers. In addition, although the first group of second material layers and the second group of second material layers are not completely alternately arranged, it is seen that most of the first and second groups of second material layers are alternately arranged.

Meanwhile, the first group of second material layers generally has a smaller optical thickness than that of the first group of first material layers. Further, the first group of second material layers has a smaller average optical thickness than that of the first group of first material layers. The second material layers having a relatively higher refractive index exhibit higher light absorption rate than that of the first material layers having a relatively lower refractive index, and thus, the first group of second material layers may be formed to have a relatively small thickness, thereby reducing light loss.

The first group of second material layers may have an optical thickness smaller than $0.25\lambda+20\%$ (that is, $0.3\lambda$). Conversely, the first group of first material layers generally has an optical thickness greater than $0.25\lambda+20\%$.

Meanwhile, although the second group of second material layers may also have a smaller optical thickness than that of the second group of first material layers so as to reduce light loss, since the second group of second material layers has a relatively smaller optical thickness than that of the first group of second material layers, reduction in thickness of the second group of second material layers does not provide a substantial effect in reduction of light loss. Therefore, the second group of second material layers and the second group of first material layers may generally have a similar optical thickness.

(Second Region)

The second region is provided to increase reflectance in a spectrum region having a shorter wavelength than the central wavelength (k). Accordingly, the first material layers and the second material layers in the second region generally have an optical thickness smaller than $0.25\lambda$.

More specifically, the second region includes a third group of first material layers having an optical thickness smaller than $0.25\lambda-10\%$ and consecutively arranged. Furthermore, the third group of first material layers has an optical thickness greater than $0.2\lambda-10\%$.

Referring to FIG. 7, it can be seen that an optical thickness deviation of the first material layers in the second region is smaller than the optical thickness deviation of the first material layers in the first region. The first group of first material layers and the second group of first material layers in the first region have clearly different optical thicknesses, and thus, the first material layers in the first region have a higher optical thickness deviation than that of the first material layers in the second region, which generally have a similar optical thickness.

Meanwhile, the second material layers in the second region include a third group of second material layers having an optical thickness smaller than $0.25\lambda-10\%$ and consecutively arranged. In the second region, only the first second material layer (that is, the second material layer in the thirteenth pair) has an optical thickness greater than $0.25\lambda-10\%$ and all of other second material layers have optical thicknesses smaller than $0.25\lambda-10\%$.

(Third Region)

The third region is disposed between the first region and the second region so as to remove ripples generated upon stacking DBRs having different reflection bands.

The third region is generally composed of a small number of pairs. As seen from FIG. 7, the first region is composed of the largest number of pairs, and the third region is composed of the smallest number of pairs.

More specifically, the third region includes a first material layer having an optical thickness smaller than $0.25\lambda-10\%$, and a first material layer having an optical thickness greater than $0.25\lambda$. Further, the third region may include a first material layer having an optical thickness greater than $0.25\lambda-10\%$ and smaller than $0.25\lambda$.

In addition, the second material layers in the third region include a second material layer having an optical thickness smaller than $0.25\lambda-10\%$, and a second material layer having an optical thickness greater than $0.25\lambda$ and smaller than $0.25\lambda+10\%$. Furthermore, the second material layers in the third region may further include a second material layer having an optical thickness greater than $0.25\lambda+10\%$.

In the third layer composed of a relatively small number of pairs, the first material layers and the second material layers have more various optical thicknesses than those of the material layers in the first region and in the second region.

According to the illustrated exemplary embodiment, the first and second material layers in the first region disposed relatively closer to the light emitting structure 30 and reflecting light in a long wavelength range are divided into the first group having a relatively higher optical thickness and the second group having a relatively smaller optical thickness, thereby enabling removal of ripples generated in the stop band as an incident angle increases.

Although FIG. 7 shows that the first region is composed of 9 pairs, the second region is composed of 7.5 pairs, and the third region is composed of 3 pairs, the inventive concepts are not limited to a particular number of pairs in each region. However, it will be advantageous that the number of pairs in the first region is greater than the number of pairs in the other regions to reinforce a reflectance of the long wavelength range.

The optical thickness of each of layers constituting the DBR may be adjusted using a simulation tool, such as Macleod® or Filmstar®. In addition, each of the material layers of the DBR may be formed on the bottom surface of the substrate 21, or on an upper surface of the light emitting structure 30 using an ion assist deposition apparatus.

Figure 8:
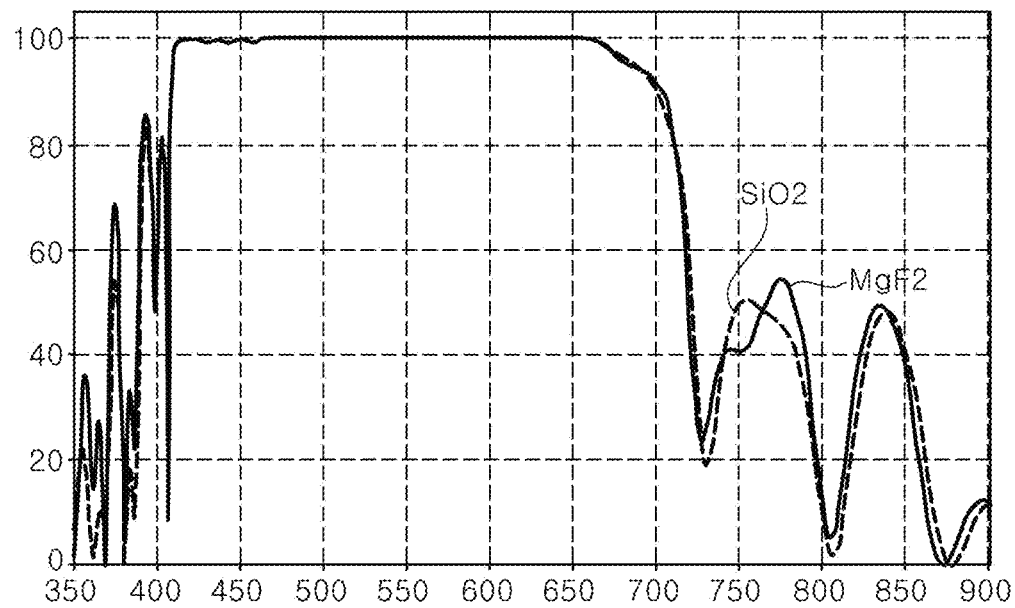
FIG. 8 is a simulation graph depicting variation in reflectance of a DBR depending upon angle of incidence according to an exemplary embodiment of the present invention.

FIG. 8 is a simulation graph depicting variation in reflectance of a DBR depending upon angle of incidence, according to an exemplary embodiment of the present invention. The graph shows both variation in reflectance using glass as the substrate and $MgF_2$ having a lower refractive index than that of the first material layer as the interfacial layer, and variation in reflectance of the comparative example using the same $SiO_2$ as the first material layer.

In the illustrated exemplary embodiment, a specific optical thickness of each of material layers of the DBR is the same as shown in the graph in FIG. 7. In addition, each of the $MgF_2$ interfacial layer and the $SiO_2$ interfacial layer having a thickness of 400 nm and the $SiO_2$ surface layer 45 having a thickness of 400 nm were added in simulation of variation in reflection characteristics.

Referring to FIG. 8, it can be confirmed that the reflectance of the $MgF_2$ interfacial layer according to the illustrated exemplary embodiment is substantially the same as that of the comparative example using the $SiO_2$ interfacial layer, and the DBR according to illustrated exemplary embodiment exhibits a reflectance of 90% or higher in a spectrum region of about 410 nm to 700 nm with respect to light entering at an angle of incidence of 0°. Accordingly, when the light emitting diode is used together with phosphors, light generated from the phosphors and entering the light emitting diode may be reflected using the DBR.

In the illustrated exemplary embodiment, in the first region of the DBR, a first group of first material layers having relatively larger optical thicknesses and a second group of first material layers having relatively smaller optical thicknesses are alternately arranged, and a first group of second material layers having relatively larger optical thicknesses and a second group of second material layers having relatively smaller optical thicknesses are also generally alternately arranged. As such, the DBR having the structure where the first and second material layers having different optical thicknesses are alternately arranged may exhibit superior reflection characteristics than the DBR having a structure where the first group and the second group are divided from each other.

Figure 9:
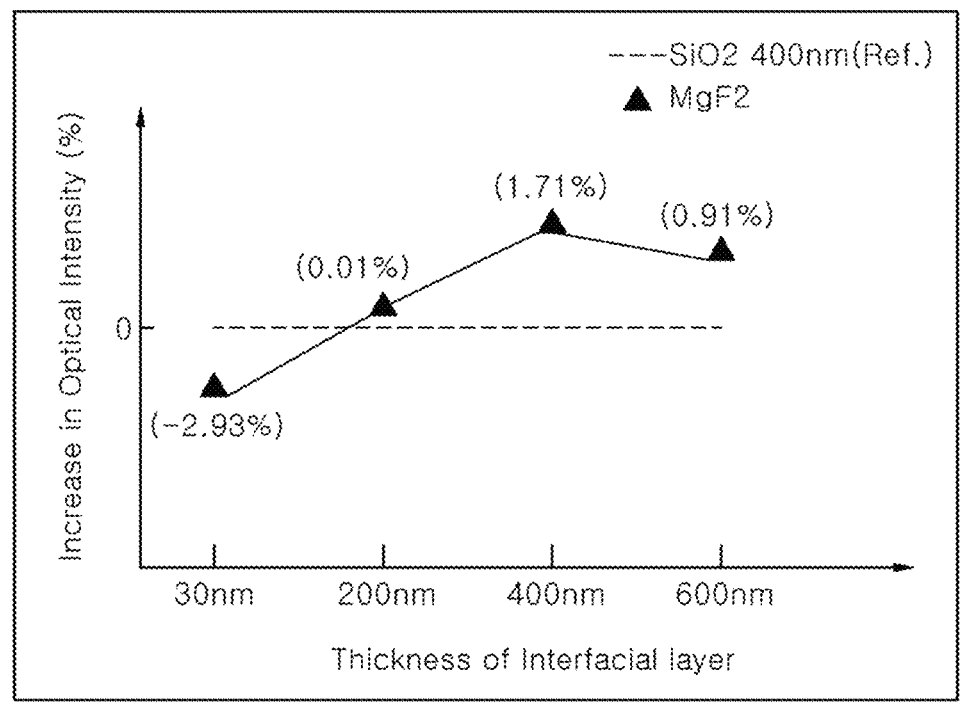
FIG. 9 is a graph depicting variation in luminous intensity of a light emitting diode depending upon thicknesses of an interfacial layer.

FIG. 9 is a graph depicting variation in luminous intensity of a light emitting diode depending upon thicknesses of an interfacial layer. The interfacial layer, a DBR, and a surface layer were applied to a sapphire substrate of the same light emitting diode having a size of $970 \times 690$ μm$^2$. Both the DBR and the surface layer had the same thickness, the luminous intensity was measured by varying thicknesses of an $MgF_2$ interfacial layer, and the variation in the luminous intensity was presented as a percentage based on the luminous intensity of the light emitting diode to which a $SiO_2$ interfacial layer of 400 nm was applied. Meanwhile, samples used herein were formed with $MgF_2$ including the DBR layer having a first sub-layer with a low density and a second sub-layer with a high density.

Referring to FIG. 9, the luminous intensity of a sample having thickness of 30 nm of the interfacial layer was lower than that of a reference sample, and the luminous intensity was slightly improved in a sample having the thickness of 200 nm. Meanwhile, a 400 nm sample showed the highest improvement in the luminous intensity, and a 600 nm sample also showed improvement in the luminous intensity. Therefore, it can be confirmed that the $MgF_2$ interfacial layer will improve luminous intensity when formed to be at 300 nm or thicker.

Figure 10A:
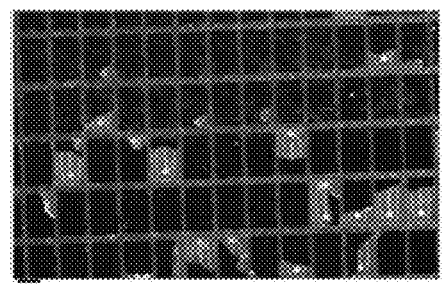
FIG. 10A is an optical photograph depicting that a DBR is peeled and a defect occurs.
Figure 10A:
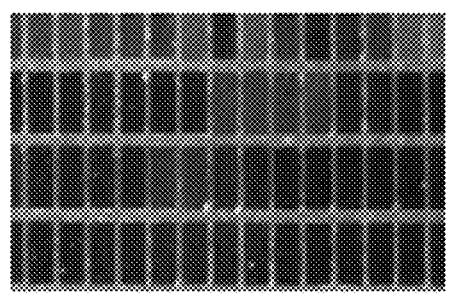

FIG. 10A is an optical photograph depicting that a DBR is peeled and a defect occurs, and FIG. 10B is an optical photograph depicting that there is no peeling of DBR occurred, according to a structure of a first layer of the DBR. Since the optical photographs were observed from a side of the substrate, an electrode structure on an upper surface thereof was not observed when the DBR remained, but the electrode structure was observed when the DBR was peeled.

A sample of FIG. 10A was formed of $MgF_2$ as an interfacial layer, all second material layers including the first layer of the DBR was formed of $TiO_2$ layers having a relatively high density, and $SiO_2$ was formed as first material layers. As shown in FIG. 10A, the DBR was peeled off in a plurality of chip regions, and the electrode structure on the upper surface was observed.

A sample of FIG. 10B is formed of $MgF_2$ as the interfacial layer, and the first $TiO_2$ layer of the DBR composed of a first sub-layer (about 25 nm) having a low density and a second sub-layer having a high density, while other first and second material layers are formed under the same conditions as those of the first and second material layers of FIG. 10A. As shown in FIG. 10B, any DBR peeling was not observed.

Figure 11:
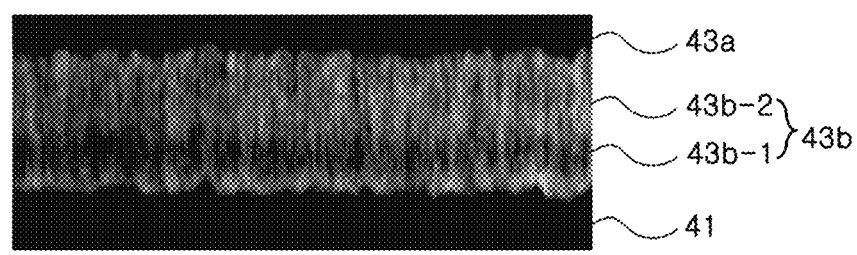
FIG. 11 is a transmission electron micrograph depicting a structure of a first layer of a DBR according to an exemplary embodiment of the present invention.

FIG. 11 is a transmission electron micrograph (TEM) depicting a structure of the first layer of the DBR in the sample of FIG. 10B.

Referring to FIG. 11, a second material layer 43b as the first layer of the DBR is disposed between an interfacial layer 41 and a first material layer 43a, and the second material layer 43b includes a first sub-layer 43b-1 and a second sub-layer 43b-2. In FIG. 11, a boundary between the first sub-layer 43b-1 and the second sub-layer 43b-2 is not clear, but the first sub-layer 43b-1 includes a relatively dark band region. It is considered that the dark band region on the TEM has a low density due to presence of many voids.

Figure 12:
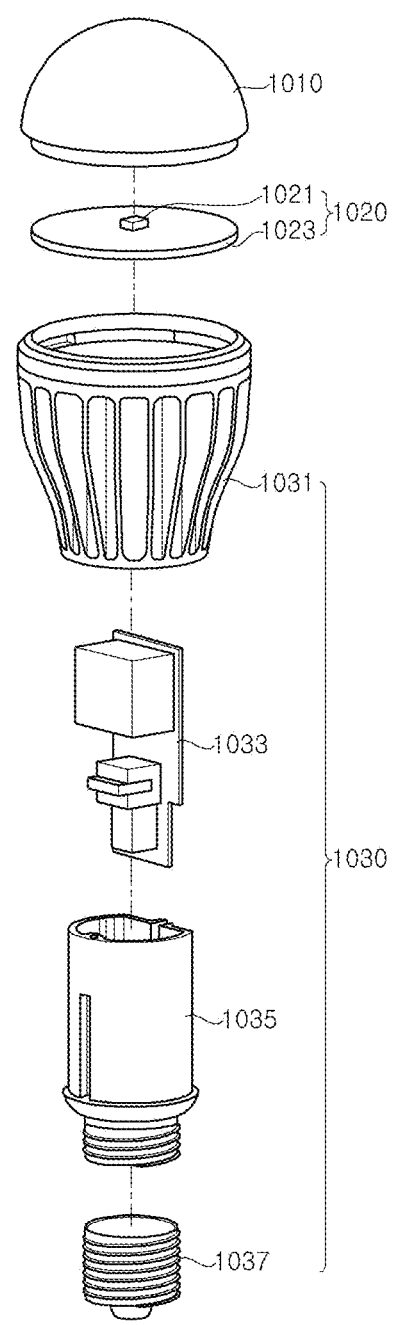
FIG. 12 is an exploded perspective view illustrating a lighting apparatus according to an exemplary embodiment of the invention.

FIG. 12 is an exploded perspective view of a lighting apparatus to which a light emitting device (e.g., a light emitting diode) according to an exemplary embodiment of the invention is applied.

Referring to FIG. 12, the lighting apparatus according to an exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper region of the light emitting diode module 1020.

The body 1030 may have any shape capable of supplying electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change, or control electric power supplied to the light emitting diode module 1020. The power supply case 1035 may receive and support the power supply 1033, and the power supply case 1035 having the power supply 1033 secured therein may be disposed within the body case 1031. The power source connection section 1037 may be disposed on a lower end of the power supply case 1035 and coupled thereto. Accordingly, the power source connection section 1037 may be electrically connected to the power supply 1033 in the power supply case 1035, and may serve as a passage through which external power may be supplied to the power supply unit 1033.

The light emitting diode module 1020 includes a substrate 1023 and a light emitting diode 1021 disposed on the substrate 1023. The light emitting diode module 1020 may be disposed on an upper region of the body case 1031 and electrically connected to the power supply 1033.

Any substrate capable of supporting the light emitting diode 1021 may be used as the substrate 1023 without limitation. For example, the substrate 1023 may include a printed circuit board having interconnections formed thereon. The substrate 1023 may have a shape corresponding to a fixing portion in the upper region of the body case 1031 so as to be stably fixed to the body case 1031. The light emitting diode 1021 may include at least one of the light emitting diodes according to the exemplary embodiments described above.

The diffusive cover 1010 is disposed on the light emitting diode 1021, and may be secured to the body case 1031 to cover the light emitting diode 1021. The diffusive cover 1010 may be formed of a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 13:
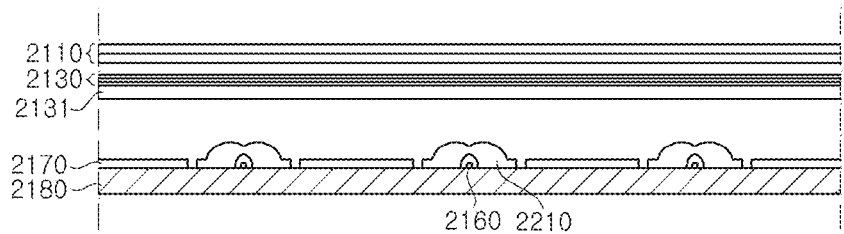
FIG. 13 is a cross-sectional view illustrating a display according to another exemplary embodiment of the invention.

FIG. 13 is a cross-sectional view of a display to which a light emitting diode according to another exemplary embodiment of the invention is applied.

The display according to an exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed on the edge of the display panel 2110 to supply driving signals to a gate line. Here, the gate driving PCBs may be formed on a thin layer transistor substrate instead of being formed on separate PCBs.

The backlight unit includes a light source module including at least one substrate and a plurality of light emitting diodes 2160. The backlight unit may further include a bottom cover 2180, a reflection sheet 2170, a diffusive plate 2131, and optical sheets 2130.

The bottom cover 2180 may be open at an upper region thereof to receive the substrate, the light emitting diodes 2160, the reflection sheet 2170, the diffusive plate 2131, and the optical sheets 2130. In addition, the bottom cover 2180 may be coupled to the panel guide. The substrate may be disposed under the reflection sheet 2170 and surrounded by the reflection sheet 2170. Alternatively, in a case that a reflective material is coated onto a surface thereof, the substrate may be disposed on the reflection sheet 2170. Further, a plurality of substrates may be arranged to be flush with each other. However, the present invention is not limited thereto, the light source module may include a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting diodes 2160. Light emitted from the light emitting diodes 2160 may be supplied in a form of sheet light to the display panel 2110 through the diffusive plate 2131 and the optical sheets 2130.

In this manner, the light emitting diodes according to the exemplary embodiments may be applied to direct type displays such as the display of FIG. 13.

Figure 14:
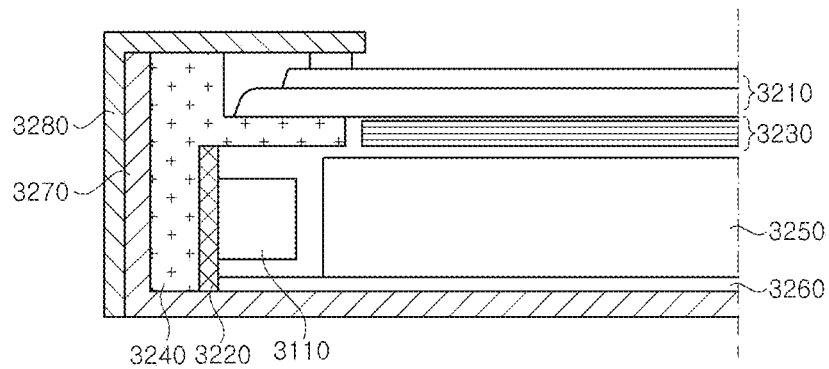
FIG. 14 is a cross-sectional view illustrating a display according to another exemplary embodiment of the invention.

FIG. 14 is a cross-sectional view of a display to which a light emitting device (a light emitting diode) according to another exemplary embodiment of the invention is applied.

The display according to an exemplary embodiment includes a display panel 3210 on which an image is displayed, and a backlight unit disposed on a rear side of the display panel 3210 and emitting light thereto. Further, the display includes a frame 240 supporting the display panel 3210 and receiving the backlight unit, and covers 3240 and 3280 surrounding the display panel 3210.

The display panel 3210 is not particularly limited and may be, for example, a liquid crystal panel including a liquid crystal layer. A gate driving PCB may be further disposed on an edge of the display panel 3210 to supply driving signals to a gate line. Here, the gate driving PCB may be formed on a thin layer transistor substrate instead of being formed on a separate PCB. The display panel 3210 may be secured by the covers 3240 and 3280 disposed on upper and lower regions thereof, and the cover 3280 disposed under the display panel 3210 may be coupled to the backlight unit.

The backlight unit supplying light to the display panel 3210 includes a lower cover 3270 partially open on an upper region thereof, a light source module disposed on one side inside the lower cover 3270, and a light guide plate 3250 disposed being flush with the light source module and converting spot light into sheet light. In addition, the backlight unit according to the illustrated exemplary embodiment may further include optical sheets 3230 disposed on the light guide plate 3250 to spread and collect light, and a reflection sheet 3260 disposed under the light guide plate 3250 and reflecting light traveling in a downward direction of the light guide plate 3250 towards the display panel 3210.

The light source module includes a substrate 3220 and a plurality of light emitting diodes 3110 disposed at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module incidents on the light guide plate 3250 and is supplied to the display panel 3210 through the optical sheets 3230. Spot light emitted from the light emitting diodes 3110 may be converted into sheet light by the light guide plate 3250 and the optical sheets 3230.

In this manner, the light emitting diodes according to the exemplary embodiments may be applied to edge type displays such as the display of FIG. 14.

Figure 15:
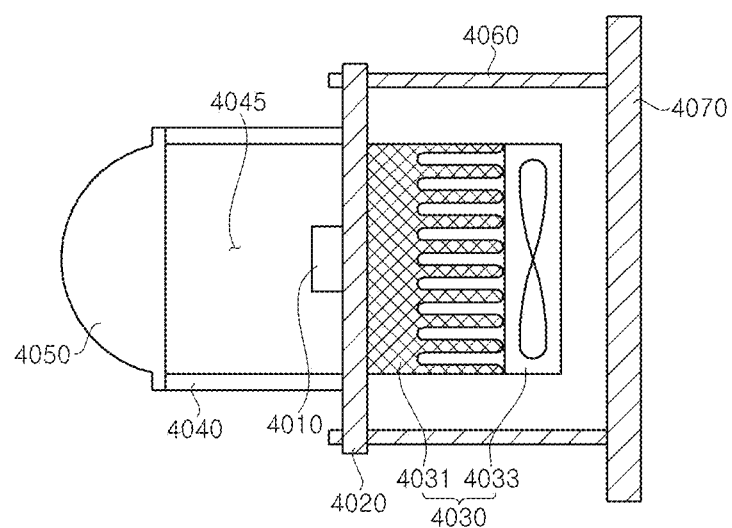
FIG. 15 is a cross-sectional view illustrating a headlight according to another exemplary embodiment of the invention.

FIG. 15 is a cross-sectional view of a headlight to which a light emitting device (a light emitting diode) according to another exemplary embodiment of the invention is applied.

Referring to FIG. 15, the headlight includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and disposed apart on the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 may be disposed on the substrate 4020 and supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be spaced apart from the light emitting diode 4010 by the connection member 4040 and disposed in a direction of supplying light emitted from the light emitting diode 4010. An orientation angle and/or a color of light emitted by the headlight may be adjusted by the cover lens 4050. Meanwhile, the connection member 4040 may serve as a light guide that provides a luminous path 4045 while securing the cover lens 4050 to the substrate 4020 and disposed to surround the light emitting diode 4010. In this case, the connection member 4040 may be formed of a light reflective material or coated therewith. Meanwhile, the heat dissipation unit 4030 may include heat dissipation fins 4031 and/or a heat dissipation fan 4033, and dissipates heat generated upon operation of the light emitting diode 4010 to the outside.

According to exemplary embodiments, by adopting an interfacial layer having a relatively low refractive index, it is possible to reduce a critical angle of light incident on the interfacial layer. Accordingly, reflection efficiency may be increased by reflecting light having a relatively large angle of incidence using total internal reflection, thereby improving the luminous efficacy. More particularly, an amount of light entering the interfacial layer and the DBR may be reduced, and light loss caused by light absorption in the interfacial layer or the DBR may be reduced. Further, although a DBR generally has poor reflectance for light having a large angle of incidence, the DBR reflects light having a relatively large angle of incidence using total internal reflection, and thus, a design margin for a DBR may be increased.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode comprising:
   a light emitting structure including an active layer;
   a first distributed Bragg reflector (DBR) disposed on one side of the light emitting structure to reflect light emitted from the light emitting structure; and
   an interfacial layer disposed between the light emitting structure and the first DBR,
   wherein the first DBR includes first material layers having a low refractive index and second material layers having a high refractive index, the first and second material layers being alternately stacked one above another, wherein the interfacial layer has a lower refractive index than the first material layers, and has a thickness greater than a thickness of each layer of the first material layers and the second material layers, and wherein one of the second material layers that is closest to the interfacial layer includes a first sub-layer and a second sub-layer, the first sub-layer having a density lower than that of the second sub-layer.

2. The light emitting diode according to claim 1, wherein the interfacial layer comprises a $MgF_2$ layer, the first material layers comprise $SiO_2$ layers, and the second material layers comprise $TiO_2$ layers.

3. The light emitting diode according to claim 1, wherein the interfacial layer is subjected to a tensile stress, the first sub-layer is subjected to a tensile stress, and the second sub-layer is subjected to a compressive stress.

4. The light emitting diode according to claim 3, wherein the first sub-layer is disposed closer to the interfacial layer than the second sub-layer.

5. The light emitting diode according to claim 3, wherein the second material layers other than the one closest to the interfacial layer have a higher density than the first sub-layer.

6. The light emitting diode according to claim 1, wherein the one of the second material layers closest to the interfacial layer contacts the interfacial layer.

7. The light emitting diode according to claim 1, further comprising a substrate,
wherein the light emitting structure is disposed on the substrate.

8. The light emitting diode according to claim 7, wherein the interfacial layer contacts the substrate and opposes the light emitting structure with the substrate interposed therebetween.

9. The light emitting diode according to claim 8, further comprising a second DBR disposed on the light emitting structure.

10. The light emitting diode according to claim 9, wherein the second DBR is disposed within an upper region of the active layer.

11. The light emitting diode according to claim 10, further comprising a transparent electrode layer covering the second DBR.

12. The light emitting diode according to claim 7, wherein the light emitting structure is disposed between the substrate and the interfacial layer.

13. The light emitting diode according to claim 12, wherein the first DBR covers an upper surface and side surfaces of the light emitting structure.

14. The light emitting diode according to claim 13, further comprising a second DBR disposed between the first DBR and the light emitting structure.

15. The light emitting diode according to claim 14, wherein the second DBR is disposed within the upper region of the active layer.

16. The light emitting diode according to claim 15, further comprising a transparent electrode layer disposed between the first DBR and the second DBR, and covering the second DBR.

17. The light emitting diode according to claim 7, wherein the first DBR is disposed within the upper region of the active layer.

18. The light emitting diode according to claim 1, further comprising a surface layer disposed on an uppermost layer of the first DBR opposite to the interfacial layer,
wherein the surface layer comprises the same material as the first material layers in the first DBR and has a greater thickness than each of the first material layers.

19. The light emitting diode according to claim 1, wherein:
the first DBR comprises:
a first region including a first group of first material layers having optical thicknesses greater than $0.25\lambda+10\%$ and a second group of first material layers having optical thicknesses greater than $0.25\lambda-10\%$ and less than $0.25\lambda+10\%$, the first and second groups of first material layers are alternately arranged in the first region;
a second region including a third group of consecutively arranged first material layers having optical thicknesses less than $0.25\lambda-10\%$; and
a third region disposed between the first region and the second region and including at least one of a fourth group of first material layers having an optical thickness smaller than $0.25\lambda-10\%$ and at least one of a fifth group of first material layers having an optical thickness greater than $0.25\lambda$; and
the first region is placed closer to the light emitting structure than the second region.

20. The light emitting diode according to claim 19, wherein:
at least one of the first group of first material layers has an optical thickness less than $0.3\lambda+10\%$; and
the third group of first material layers has an optical thickness greater than $0.2\lambda-10\%$.

21. The light emitting diode according to claim 19, wherein an optical thickness deviation of the first material layers in the first region is greater than that of the first material layers in the second region.

22. The light emitting diode according to claim 19, wherein:
the second material layers in the first region include a first group of second material layers having optical thicknesses greater than $0.25\lambda+10\%$ and a second group of second material layers having optical thicknesses greater than $0.25\lambda-10\%$ and less than $0.25\lambda+10\%$;
the second material layers in the second region include a third group of consecutively arranged second material layers having optical thicknesses less than $0.25\lambda-10\%$; and
the second material layers in the third region include at least one of a fourth group of second material layers having an optical thickness less than $0.25\lambda-10\%$ and at least one of a fifth group of second material layers having an optical thickness greater than $0.25\lambda$ and less than $0.25\lambda+10\%$.

* * * * *